(12) United States Patent
Reusswig et al.

(10) Patent No.: US 10,714,169 B1
(45) Date of Patent: Jul. 14, 2020

(54) SYSTEM AND METHOD FOR PROGRAMMING NON-VOLATILE MEMORY DURING BURST SEQUENTIAL WRITE

(71) Applicant: SanDisk Technologies LLC, Addison, TX (US)

(72) Inventors: Phil Reusswig, San Jose, CA (US); Pitamber Shukla, San Jose, CA (US); Sarath Puthenthermadam, San Jose, CA (US); Mohan Dunga, San Jose, CA (US); Sahil Sharma, San Jose, CA (US); Rohit Sehgal, San Jose, CA (US); Niles Yang, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/437,355

(22) Filed: Jun. 11, 2019

(51) Int. Cl.
*G11C 11/56* (2006.01)
*G11C 16/10* (2006.01)
*G11C 16/14* (2006.01)
*G11C 16/26* (2006.01)
*G11C 16/04* (2006.01)

(52) U.S. Cl.
CPC ...... *G11C 11/5628* (2013.01); *G11C 11/5635* (2013.01); *G11C 11/5671* (2013.01); *G11C 16/0483* (2013.01); *G11C 16/10* (2013.01); *G11C 16/14* (2013.01); *G11C 16/26* (2013.01); *G11C 2211/5622* (2013.01)

(58) Field of Classification Search
CPC ..... G11C 11/5628; G11C 16/26; G11C 16/14; G11C 16/3427; G11C 11/5635; G11C 16/0483; G11C 11/5671; G11C 16/10; G11C 2211/5622
See application file for complete search history.

(56) References Cited

U.S. PATENT DOCUMENTS

2012/0324178 A1* 12/2012 Yoon ................. G11C 16/3418
711/154

* cited by examiner

*Primary Examiner* — David Lam
(74) *Attorney, Agent, or Firm* — Dickinson Wright PLLC; Steven Hurles

(57) ABSTRACT

A non-volatile memory system and corresponding method of operation are provided. The system includes non-volatile memory cells, each retaining a threshold voltage within a threshold window. The non-volatile memory cells include multi-bit cells each configured to store a plurality of bits of data with the threshold window partitioned into bands each having a band width. The bands include a lowest band denoting an erased state and increasing bands. A control circuit programs a first set of the data into the multi-bit cells in a single-bit mode using first target states being one of the erased state and a tight intermediate state having a distribution of the threshold voltage no wider than the band width of one of the increasing bands. The control circuit also programs a second set of the data into the multi-bit cells in a multi-bit mode with each of the multi-bit cells storing the plurality of bits.

20 Claims, 13 Drawing Sheets

LM-FINE DEFAULT PGM SEQUENCE

| WL | STRG | LM | FINE (W IDL READ) |
|---|---|---|---|
| WL0 | 0 | 0 | 8' |
|  | 1 | 1 | 9' |
|  | 2 | 2 | 10' |
|  | 3 | 3 | 11' |
| WL1 | 0 | 4 | 16' |
|  | 1 | 5 | 17' |
|  | 2 | 6 | 18' |
|  | 3 | 7 | 19' |
| WL2 | 0 | 12 | 24' |
|  | 1 | 13 | 25' |
|  | 2 | 14 | 26' |
|  | 3 | 15 | 27' |
| WL94 | 0 | 748 | 760' |
|  | 1 | 749 | 761' |
|  | 2 | 750 | 762' |
|  | 3 | 751 | 763' |
| WL95 | 0 | 756 | 764' |
|  | 1 | 757 | 765' |
|  | 2 | 758 | 766' |
|  | 3 | 759 | 767' |

FIG. 9

LM WHOLE BLOCK - FINE PGM SEQUENCE

| WL | STRG | LM | FINE (W IDL READ) |
|---|---|---|---|
| WL0 | 0 | 0 | 384' |
|  | 1 | 1 | 385' |
|  | 2 | 2 | 386' |
|  | 3 | 3 | 387' |
| WL1 | 0 | 4 | 388' |
|  | 1 | 5 | 389' |
|  | 2 | 6 | 390' |
|  | 3 | 7 | 391' |
| WL2 | 0 | 8 | 392' |
|  | 1 | 9 | 393' |
|  | 2 | 10 | 394' |
|  | 3 | 11 | 395' |
| WL94 | 0 | 376 | 760' |
|  | 1 | 377 | 761' |
|  | 2 | 378 | 762' |
|  | 3 | 379 | 763' |
| WL95 | 0 | 380 | 764' |
|  | 1 | 381 | 765' |
|  | 2 | 382 | 766' |
|  | 3 | 383 | 767' |

LM PASS IN WHOLE BLOCK AND THEN DO FINE PASS

FIG. 10

SYSTEM AND METHOD FOR PROGRAMMING NON-VOLATILE MEMORY DURING BURST SEQUENTIAL WRITE

FIELD

This application relates to the operation of re-programmable non-volatile memory systems such as semiconductor flash memory, and, more specifically, to non-volatile memory systems having efficient programming schemes and caching.

BACKGROUND

This section provides background information related to the technology associated with the present disclosure and, as such, is not necessarily prior art.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a conductive floating gate or a non-conductive charge-trapping material can be used in some types of memory cells to store a charge which represents a data state. The memory cell may be a transistor in which the charge storing material may reside between a channel and a control gate. The charge-storing material may be insulated from both the channel and the control gate. The charge-storing material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

Some types of memory cells may be programmed by altering the charge in the charge-storing material, thereby altering the threshold voltage (Vth) of the memory cell transistor. In one technique, a program voltage is applied to the control gate with a low voltage in the channel to add charge to the charge-storing material. After applying the program voltage, the memory cell's threshold voltage is tested by applying a verify voltage to the control gate, and testing whether the memory cell conducts a significant current. Additional program voltages may be applied to control gate, followed by verify voltages, until the memory cell's threshold current is within a target range.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Each memory cell of a memory array of a non-volatile memory system can to store a single bit of data by operating in a binary or single-bit mode, where two ranges of threshold levels of the storage element transistors are defined as storage levels. The threshold levels of transistors correspond to ranges of charge levels stored on their memory cells. The density of data storage of such memory arrays can be increased by storing more than one bit of data in each memory cell transistor. This is accomplished by defining more than two threshold levels as storage states for each memory cell transistor. For example, four such states may correspond with 2 bits of data per memory cell. More storage states, such as 16 states per memory cell, are also being implemented. Each memory cell transistor has a certain total range (threshold window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

Memory cells of the non-volatile memory system may be erased by a number of mechanisms. For example, a memory cell can be electrically erasable, by applying a high voltage to the substrate relative to the control gate so as to induce electrons in the floating gate to tunnel through a thin oxide to the substrate channel region (i.e., Fowler-Nordheim tunneling). Typically, the memory is electrically erasable either all at once or one or more minimum erasable blocks at a time, where a minimum erasable block may consist of one or more sectors and each sector may store 512 bytes or more of data.

Additionally, in order to provide acceptable performance of the non-volatile memory system for certain writing operations, it is also known to utilize to memory cells to temporarily store bits of data as a cache thereby improving performance of the non-volatile memory system. Such cache data may be copied out of those memory cells operating as the cache and rewriting the cache data back to other memory cells. However, such cache operation can adversely affect the durability or lifetime of the non-volatile memory system due to the number of times the memory cells may be electrically erased before writing data.

Accordingly, there is still a need for more improved non-volatile memory systems while providing adequate performance and durability.

SUMMARY

This section provides a general summary of the present disclosure and is not a comprehensive disclosure of its full scope or all of its features and advantages.

An object of the present disclosure is to provide a non-volatile memory system and a method of operating the non-volatile memory system that address and overcome the above-noted shortcomings.

Accordingly, it is an aspect of the present disclosure to provide an apparatus. The apparatus includes a plurality of non-volatile memory cells and word lines. Each of the plurality of non-volatile memory cells is associated with one of the word lines and is configured to retain a threshold voltage within a common range of threshold voltages defining a threshold window. The plurality of non-volatile memory cells include a plurality of multi-bit cells. Each of the plurality of multi-bit cells is configured to store a plurality of bits of data with the threshold window partitioned into a plurality of bands of threshold voltages representing the plurality of bits each having a band width. The plurality of bands of threshold voltages includes a lowest band denoting an erased state and a plurality of increasing bands. The apparatus includes a control circuit in communication with the plurality of non-volatile memory cells and word lines. The control circuit is configured to program a first set of the data into the plurality of multi-bit cells associated with selected word lines in a single-bit mode with each of the plurality of multi-bit cells storing one bit using a pair of first target states. The pair of first target states represent the one bit and include the erased state and a tight intermediate state having a distribution of the threshold voltage being no wider than the band width of a single one of the plurality of increasing bands. The control circuit is also configured to program a second set of the data into the plurality of multi-bit cells associated with selected word lines in a multi-bit mode, with each of the plurality of multi-bit cells storing the plurality of bits.

According to another aspect of the disclosure, a non-volatile memory system is provided. The non-volatile memory system includes a plurality of non-volatile memory cells and word lines. Each of the plurality of non-volatile memory cells is associated with one of the word lines and is configured to retain a threshold voltage within a common range of threshold voltages defining a threshold window. The plurality of non-volatile memory cells include a plurality of multi-bit cells that are each configured to store a plurality of bits of data. The threshold window is partitioned into a plurality of bands of threshold voltages representing the plurality of bits and each of the plurality of bands of threshold voltages has a band width. The plurality of bands of threshold voltages include a lowest band denoting an erased state and a plurality of increasing bands. The non-volatile memory system also includes a data programming means for programming a first set of the data into the plurality of multi-bit cells associated with selected word lines in a single-bit mode with each of the plurality of multi-bit cells storing one bit using a pair of first target states representing the bit. The pair of first target states include the erased state and a tight intermediate state having a distribution of the threshold voltage being no wider than the band width of a single one of the plurality of increasing bands. The data programming means is also used for programming a second set of the data into the plurality of multi-bit cells associated with selected word lines in a multi-bit mode with each of the plurality of multi-bit cells storing the plurality of bits.

According to another yet aspect of the disclosure, a method of operating a non-volatile memory system is also provided. The method includes the step of providing the non-volatile memory system with a plurality of non-volatile memory cells and word lines. Each of the plurality of non-volatile memory cells is associated with one of the word lines and is configured to retain a threshold voltage within a common range of threshold voltages defining a threshold window. The plurality of non-volatile memory cells include a plurality of multi-bit cells each configured to store a plurality of bits of data. The threshold window is partitioned into a plurality of bands of threshold voltages that represent the plurality of bits, each having a band width. The plurality of bands of threshold voltages include a lowest band denoting an erased state and a plurality of increasing bands. The method continues with the step of programming a first set of the data into the plurality of multi-bit cells associated with selected word lines in a single-bit mode. In the single-bit mode, each of the plurality of multi-bit cells stores one bit using a pair of first target states representing the one bit. The pair of first target states include the erased state and a tight intermediate state having a distribution of the threshold voltage being no wider than the band width of a single one of the plurality of increasing bands. The method proceeds with the step of programming a second set of the data into the plurality of multi-bit cells associated with selected word lines in a multi-bit mode with each of the plurality of multi-bit cells storing the plurality of bits.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 5:
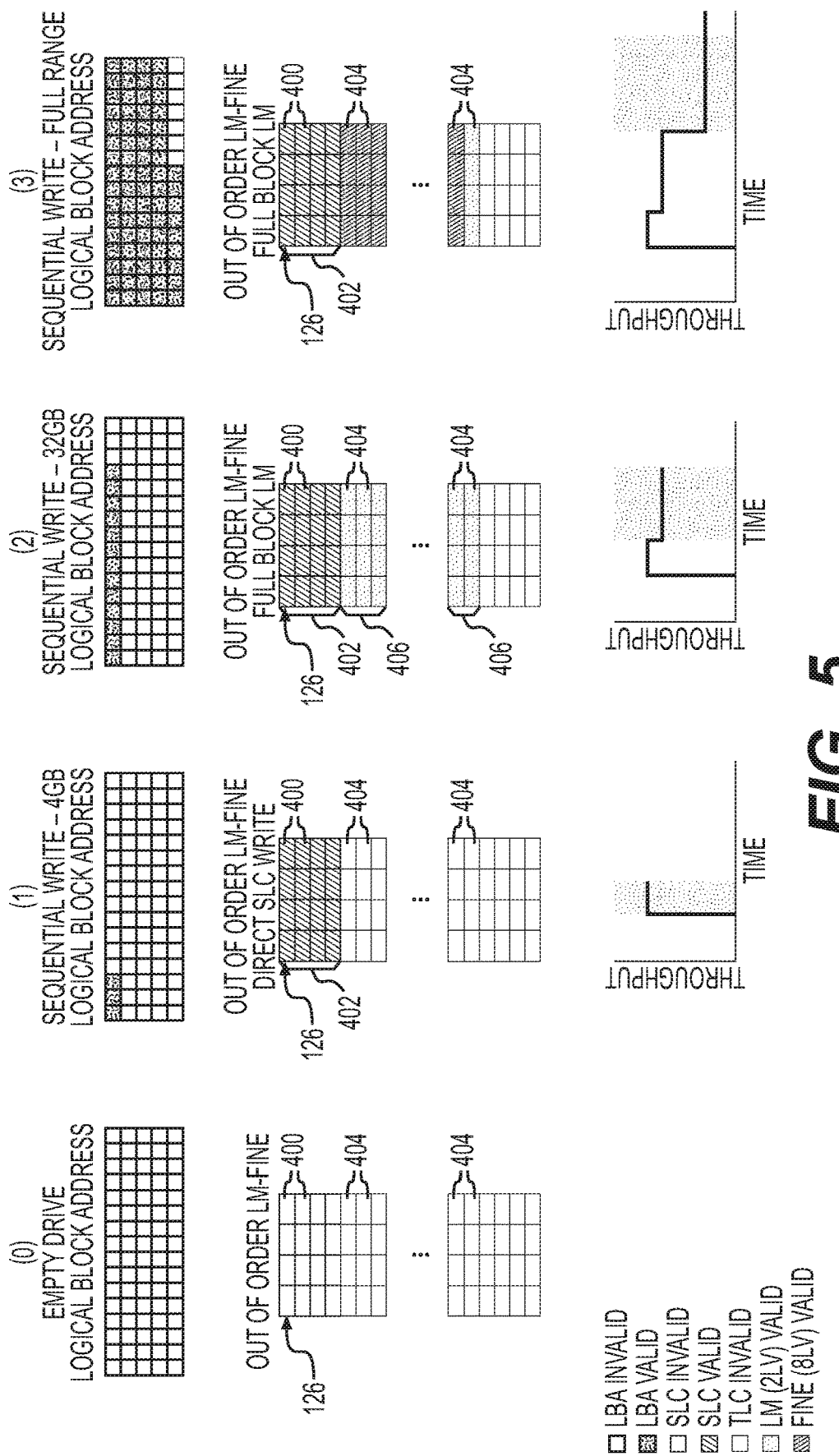
Figure 6:
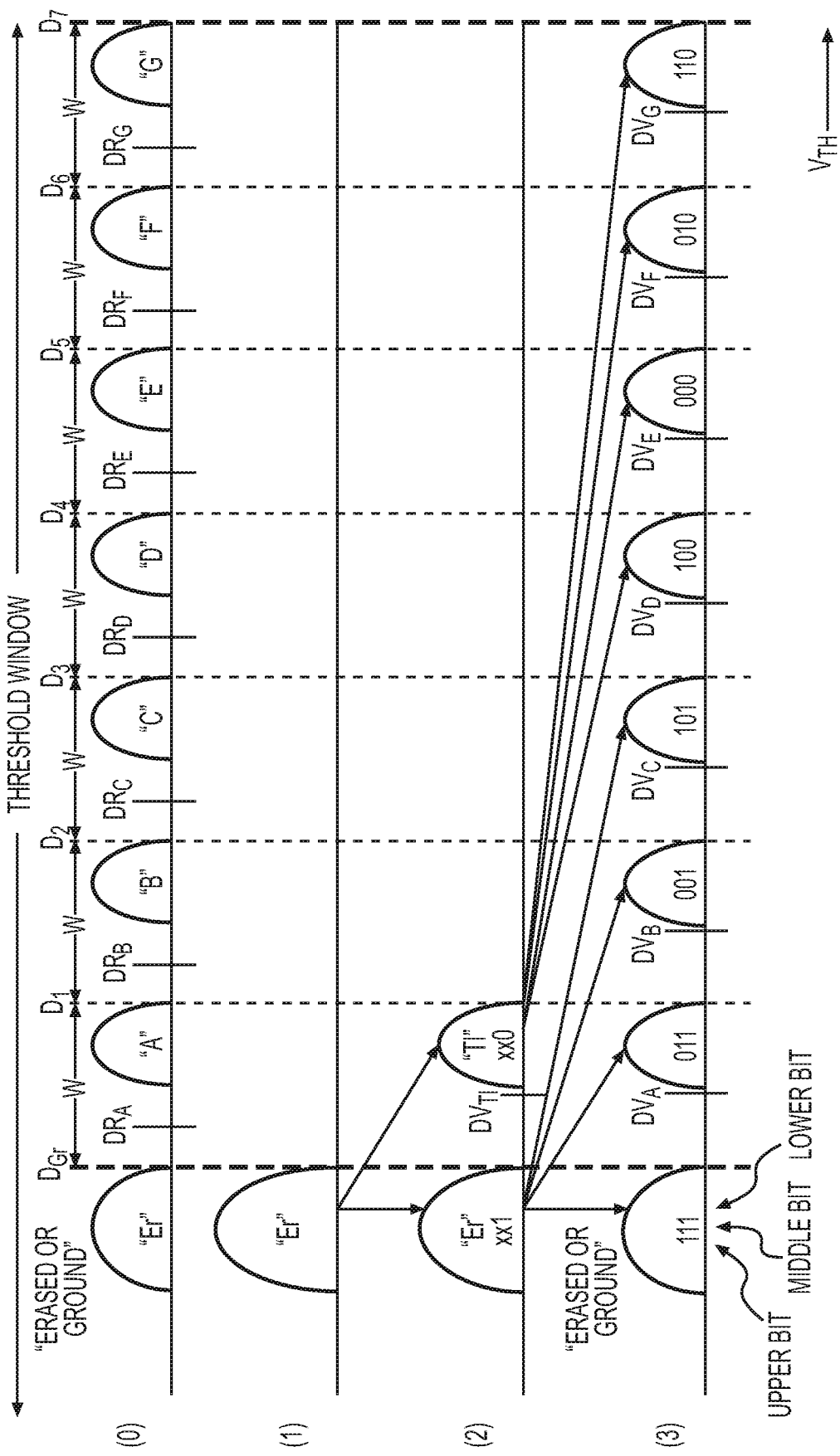
Figure 8:
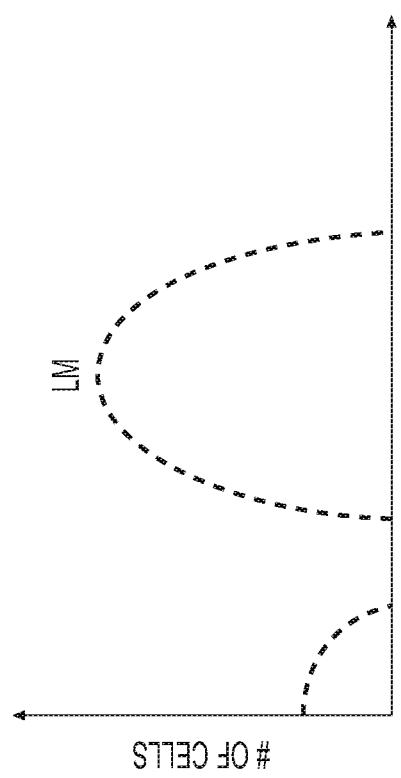
Figure 7:
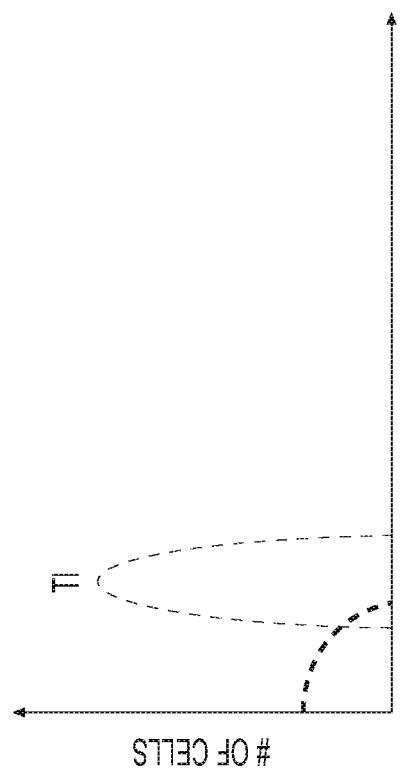
Figure 11:
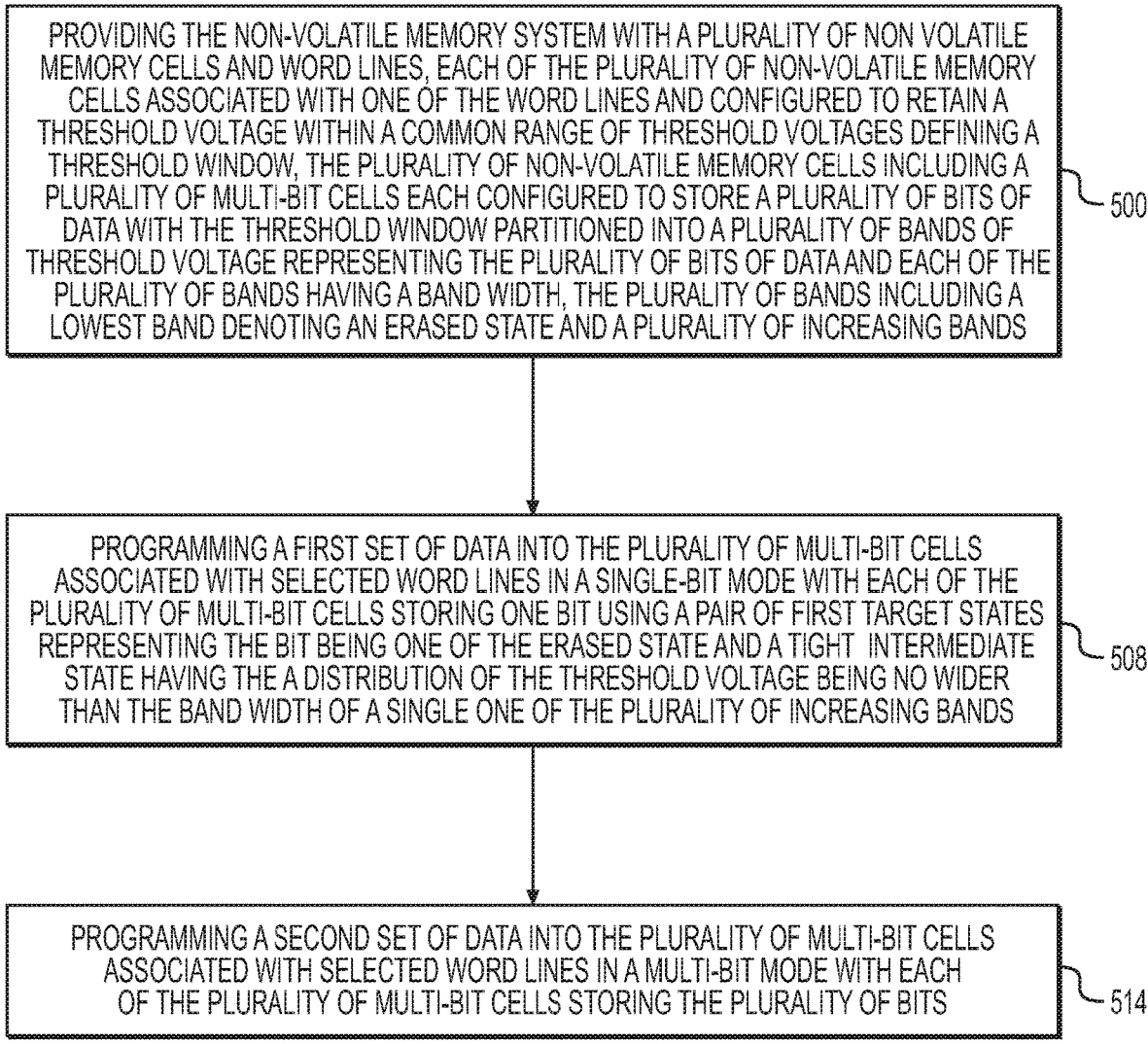
Figure 12:
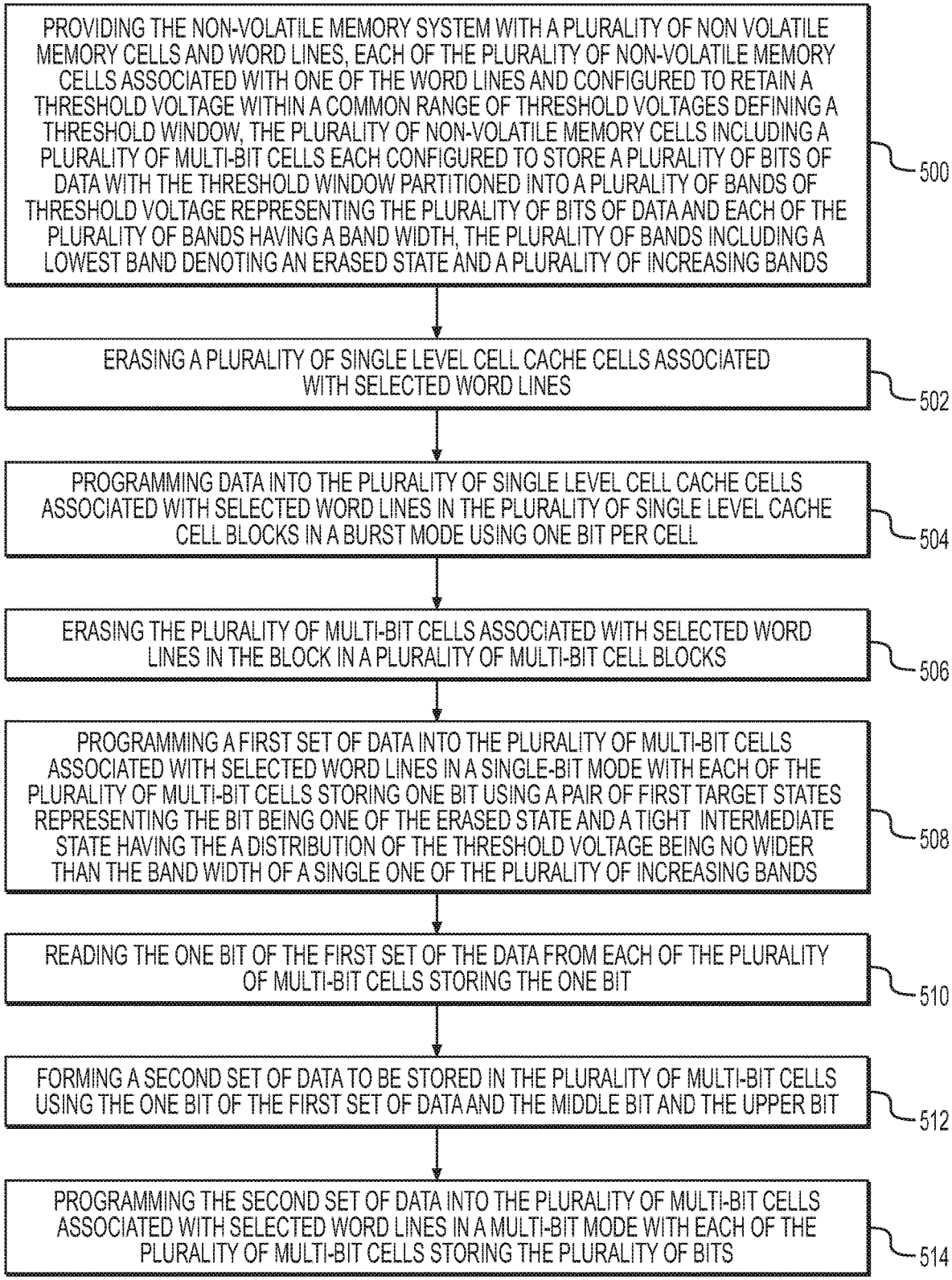

FIGS. 5(0)-5(3) illustrate a memory structure including a static single level cell cache and a plurality of multi-bit cell blocks in addition to corresponding throughput during operation according to aspects of the disclosure;

FIGS. 6(0)-6(3) illustrate the programming of an 8-state non-volatile memory system with a tight intermediate state ("TI") initially before being programmed to a fine state according to aspects of the disclosure;

FIG. 7 illustrates a typical threshold voltage distribution for LM programming;

FIG. 8 shows threshold voltage distribution of the tight intermediate state ("TI") according to aspects of the disclosure;

FIG. 9 illustrates a sequence of LM-Fine default programming;

FIG. 10 illustrates a sequence of LM-Fine whole block programming according to aspects of the disclosure; and FIGS. 11 and 12 illustrate steps of a method of operating a non-volatile memory system according to aspects of the disclosure.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory systems of the type well-suited for use in many applications. The non-volatile memory system and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

A common benchmark for solid state drives and other non-volatile memory systems is sustained sequential write. In order to provide acceptable performance during sustained sequential writes and other writing operations, some memory cells that typically store more than one bit of data may be operated in a binary mode of operation (single level cell or SLC) to provide a dynamic cache (the number of memory cells operating in the binary mode of operation can be increased or decreased as needed). Later, or during idle time, such cache data stored as single bits may be compacted by copying the cache data out of those memory cells operating in the binary mode of operation and rewriting the cache data back to memory cells storing more than one bit of data per cell (e.g., triple level cell or TLC). However, because memory cells must be electrically erased before writing data, such dynamic cache operation typically results in multiple erase operations. For example, if three bits of data are typically stored to each memory cell, the dynamic cache operation described would result in four erase cycles, three SLC, and one TLC. This increased number of erase operations can adversely affect the durability or lifetime of the solid-state memory.

In addition, the charge programmed into the charge storage element of one memory cell can produce an electric field that may perturb the electric field of a neighboring memory cell. Generally, an erased cell has no charge in its floating gate and has the lowest threshold voltage. As the memory cell is increasingly programmed with more charges into the floating gate, its threshold voltage increases. The memory cell generally operates within a range of threshold voltages (threshold window). The threshold window is partitioned into a plurality of subranges or bands of threshold voltages, each representing a memory state. As a field-effect transistor with a floating gate, the charges programmed into the floating gate of a memory cell determines its threshold voltage and which in turn determines what memory state it is in. However, as the intercellular distance is shrunk, the memory cell may begin to "see" the charges programmed into the floating gates of its neighbors. Thus, it sees more charge than it really has and has the virtual effect of increasing its threshold voltage.

If a memory cell is program-verified under a first field environment and later is read again under a different field environment due to neighboring cells subsequently being programmed with different charges, the read accuracy may be affected by what is referred to as the "Yupin Effect" which is a disturb due to coupling between neighboring floating gates. With ever higher integration in semiconductor memories, the perturbation of the electric field due to the stored charges between memory cells (Yupin effect) becomes increasing appreciable as the inter-cellular spacing shrinks.

The Yupin effect can be mitigated by minimizing the asymmetry in field environment for a cell due to its neighbors, between the time the cell has finished program-verify (i.e., programmed to its target state) to the time when its neighbors has finished programming. In this way, when the cell is being program-verified at its target state, it sees a first field environment due to its neighbors, and subsequently with the completion of programming of its neighbors, it see a second field environment, and the difference between these two field environment are minimized. The Yupin effect is a program disturb that affects adjacent cells along a row and across bit lines (BL-BL Yupin effect) and along a column across word lines (WL-WL Yupin effect) of a memory array.

One way to reduce BL-BL Yupin effect is to adopt a multi-pass programming scheme for programming a page of memory cells on a word line in parallel. In a first programming pass, the memory cells targeted to the more programmed states (ones that will have their threshold voltages moved from an erased state at a lower end of the threshold window to a higher end) are initially programmed to a staging area near halfway of the threshold window. In subsequent programming passes, they are programmed from the staging area to their final target destinations. In this way, the difference between the first and second field environment seen by a memory cell is due to the threshold voltages of its neighbors not moving across the full extent but at most across half of the threshold window.

A common method of implementing the above-mentioned multi-pass programming is performed a series of binary programming, in which at each programming pass the threshold window is binary divided and memory cells with target states belonging to the upper half of the binary divisions is programmed to the lower middle portion of the binary divisions. Each further programming pass iterates the binary division programming until in a final programming pass all memory cells of the page are programmed to their final destinations. A preferred coding that goes along with such programming scheme is given by the "LM" coding. However, the LM coding and programming method has known drawbacks for certain applications.

Figure 1:
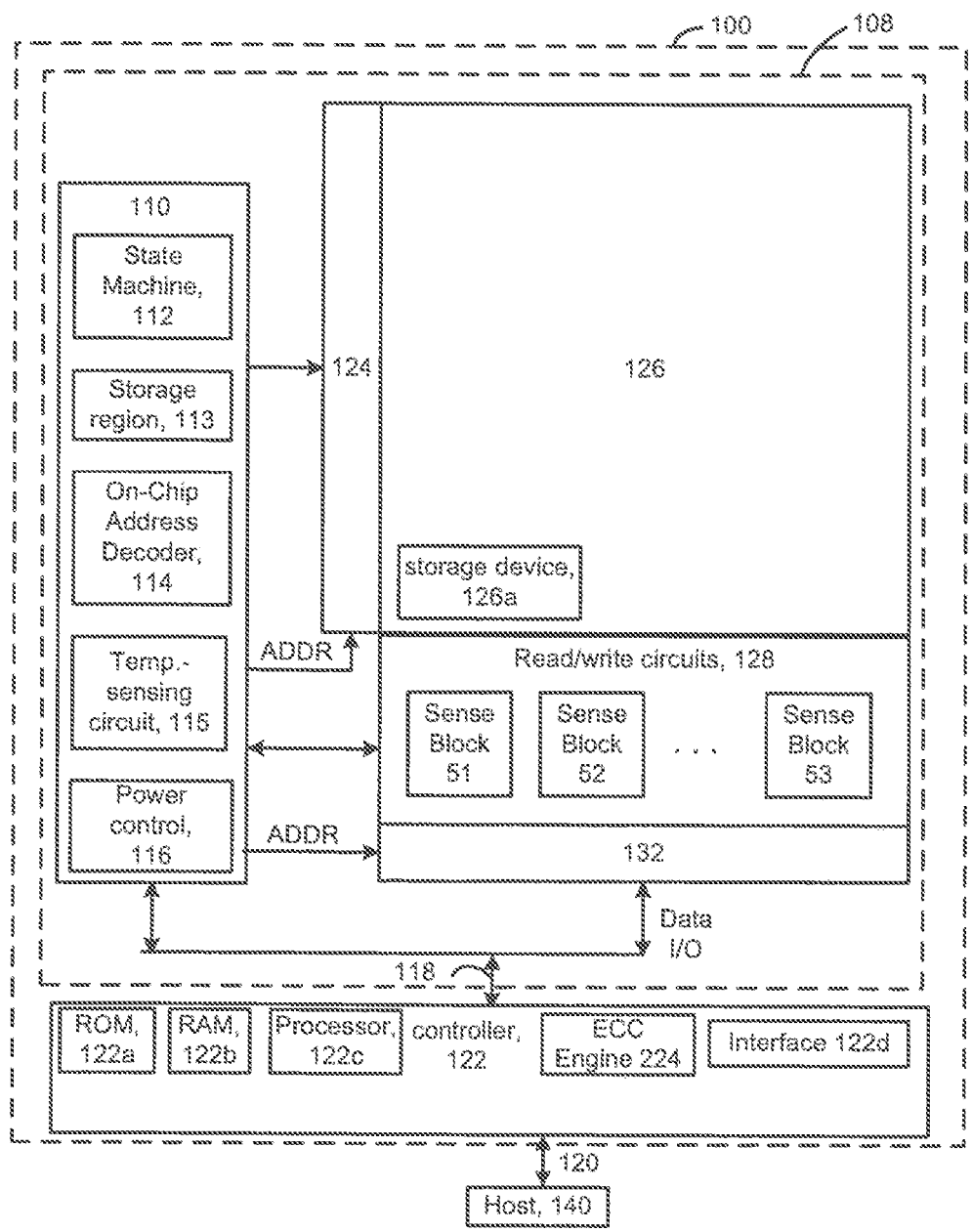
FIG. 1 is a functional block diagram of a non-volatile memory system in which embodiments may be practiced according to aspects of the disclosure.

FIG. 1 is a block diagram of an example memory system 100 in which embodiments may be practiced. The memory system 100, such as a non-volatile storage system, may include one or more memory die 108. The memory die 108 includes a memory structure 126 of non-volatile memory cells 127 (FIG. 3B), such as an array of memory cells, control circuitry or control circuit 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory system 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The control circuitry 110 may include a temperature-sensing circuit 115 which may be used by the state machine 112 to determine a present temperature. In one embodiment, the temperature-sensing circuit 115 outputs a temperature code, which may be a binary string. The temperature-sensing circuit 115 senses a temperature at which memory cells on a selected word line are programmed. A storage region 113 contains registers for storing the temperature codes or other information, at least temporarily.

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string. In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth. The control circuit may also be referred to as a managing circuit.

The off-chip controller 122 (which in one embodiment is an electrical circuit) may comprise a processor 122c, storage devices (memory) such as ROM 122a and RAM 122b and an error-correction code (ECC) engine 224. The ECC engine can correct a number of read errors.

A memory interface 122d may also be provided. The memory interface, in communication with ROM, RAM and processor 122c, is an electrical circuit that provides an electrical interface between controller 122 and memory die. For example, the memory interface 122d can change the format or timing of signals, provide a buffer, isolate from surges, latch I/O and so forth. The processor 122c can issue commands to the control circuitry 110 (or any other component of the memory die) via the memory interface 122d.

The storage device comprises code such as a set of instructions, and the processor 122c is operable to execute the set of instructions to provide the functionality described herein. Alternatively or additionally, the processor 122c can access code from a storage device 126a of the memory structure 126, such as a reserved area of memory cells in one or more word lines.

For example, code can be used by the controller 122 to access the memory structure 126 such as for programming, read and erase operations. The code can include boot code and control code (e.g., a set of instructions). The boot code is software that initializes the controller 122 during a booting or startup process and enables the controller 122 to access the memory structure. The code can be used by the controller 122 to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host 140 is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate). In one embodiment, vertically orientated NAND strings extend perpendicular to the major surface of the substrate.

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2A:
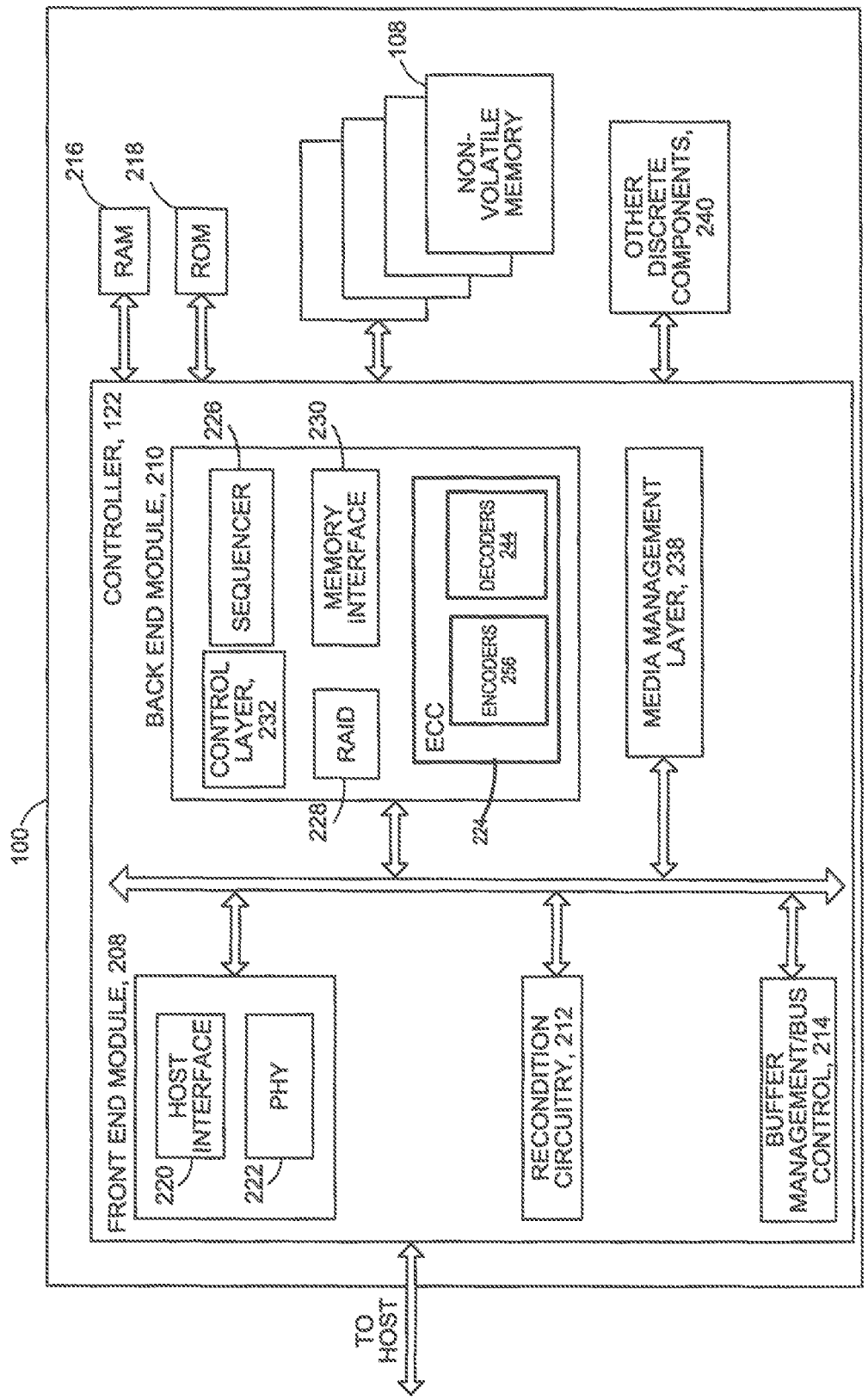
FIG. 2A is a block diagram of the example non-volatile memory system depicting additional details of a controller of the non-volatile memory system of FIG. 1 according to aspects of the disclosure.

FIG. 2A is a block diagram of the example memory system 100, depicting additional details of the controller 122. In one embodiment, the controller 122 is a flash controller. As used herein, a memory controller is a device that manages data stored on memory and communicates with a host 140 (FIG. 1), such as a computer or electronic device. A memory controller can have various functionality in addition to the specific functionality described herein. For example, the memory controller can format the memory to ensure the memory is operating properly, map out bad memory cells, and allocate spare memory cells to be substituted for future failed cells. Some part of the spare cells can be used to hold firmware to operate the memory controller and implement other features. In operation, when a host needs to read data from or write data to the memory, it will communicate with the memory controller. If the host 140 provides a logical address to which data is to be read/written, the memory controller can convert the logical address received from the host to a physical address in the memory. (Alternatively, the host 140 can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable interface. In one embodiment, memory system 100 may be a card based system, such as a secure digital (SD) or a micro secure digital (micro-SD) card. In an alternate embodiment, the memory system may be part of an embedded memory system. For example, the memory may be embedded within the host, such as in the form of a solid state disk (SSD) drive installed in a personal computer.

In some embodiments, the memory system 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller 122 may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2A is one example implementation that may (or may not) use the components of the controller 122 depicted in FIG. 1 (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2A as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. The ECC engine 224 has one or more decoders 244 and one or more encoders 256. In one embodiment, the ECC engine 224 comprises a low-density parity check (LDPC) decoder. In one embodiment, the decoders 244 include a hard decoder and a soft decoder. An output of one or more decoders 244 may be provided to the host.

A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A control layer 232 controls the overall operation of back end module 210.

Additional components of memory system 100 include media management layer 238, which performs wear leveling of memory cells of non-volatile memory die 108. The memory system 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Media Management Layer (MML) 238 may be integrated as part of the management that may handle errors and interfacing with the host. In one embodiment, MML 238 is a Flash Translation Layer (FTL). MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory system 100) implement a solid state drive (SSD), which can emulate, replace or be used instead of a hard disk drive inside a host, as a network-attached storage (NAS) device, and so forth. Additionally, the SSD need not be made to work as a hard drive.

Figure 2B:
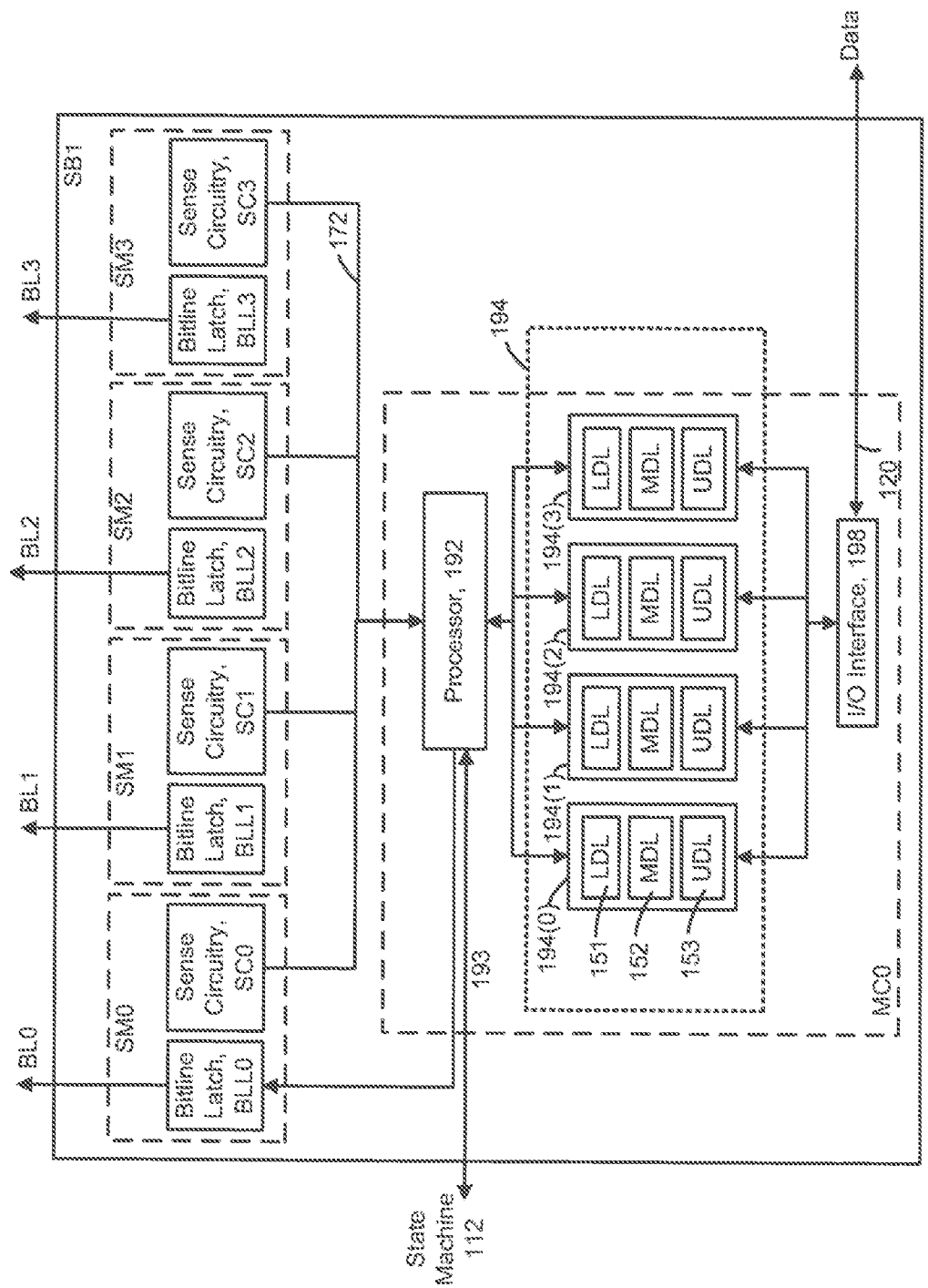
FIG. 2B is a block diagram depicting one embodiment of a sense block according to aspects of the disclosure.

FIG. 2B is a block diagram depicting one embodiment of one of the sense blocks (e.g., SB 51) of FIG. 1A. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194(0), 194(1), 194(2) and 194(3) and an I/O interface 198 coupled between the sets of data latches 194 and the data bus 120. In this example, each set of latches is associated with one of the bit lines. For example, data latches 194(0) are associated with bit line BL0, data latches 194(1) are associated with bit line BL1, data latches 194(2) are associated with bit line BL2, and data latches 194(3) are associated with bit line BL3. Each set of data latches includes data latches identified by LDL 151, MDL 152, and UDL 153, in this embodiment. LDL 151 stores a bit for a lower page (LP) of write data, MDL 152 stores a bit for a middle page (MP) of write data, and UDL 153 stores a bit for an upper page (UP) of write data, in a memory which stores three bits of data in each memory cell. Note that there may be one set of such latches associated with each bit line. Thus, there may be a page of latches 194 associated with a page of memory cells. The latches 194 may also be used to store data read from the non-volatile memory cells.

Additional or fewer data latches per set could be used as well. For example, in a two-bit per memory cell implementation, the MDL data latch for the middle page (MP) of data is not needed. A four-bit per memory cell implementation can use LDL, LMDL (lower-middle page), UMDL (upper-middle page), and UDL latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., $DR_A$, $DR_B$, $DR_C$, $DR_D$, $DR_E$, $DR_F$, and $DR_G$ in FIG. 6(0)-6(3)) corresponding to the various memory states supported by the memory (e.g., states A, B, C, D, E, F, and G), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the data latches 194. For example, the memory state for a memory cell associated with bit line BL0 may be stored in latches 194(0), etc. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the data latches 194 from the data bus 120, in the LDL, MDL, and UDL data latches. For example, the data to be programmed in a selected memory cell associated with bit line BL0 may be stored in latches 194(0), the data to be programmed in a selected memory cell associated with bit line BL1 may be stored in latches 194(1), etc. The programming operation, under the control of the state machine, comprises a series of programming voltage pulses (FIG. 4) applied to the control gates of the addressed memory cells. Each programming voltage is followed by a read back (verify test) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194 may be implemented as a stack of data latches for each sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3A:
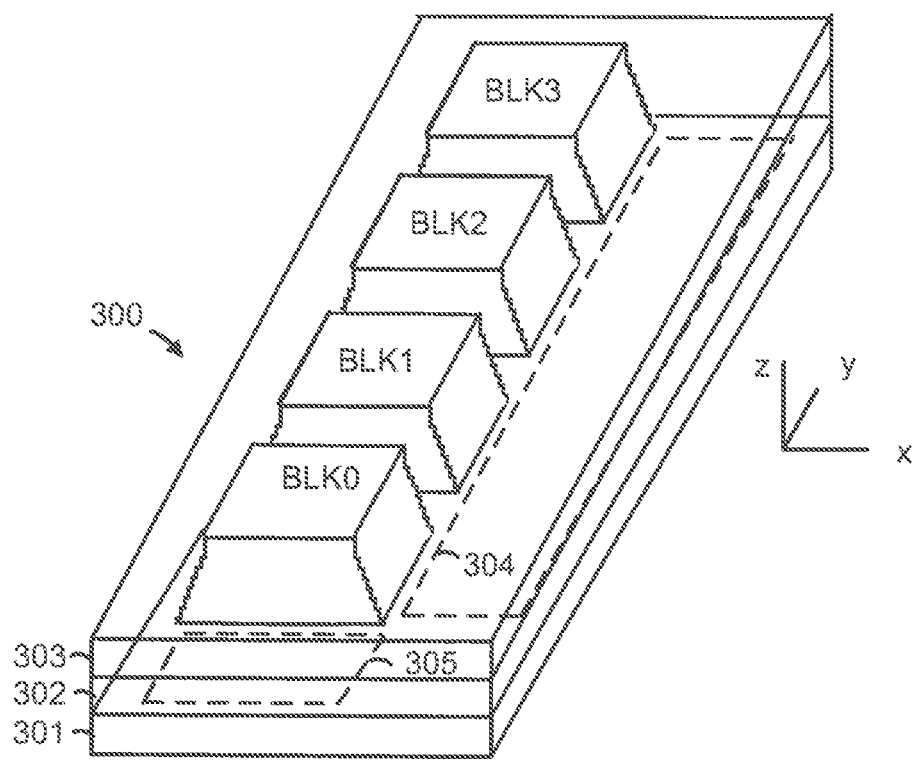
FIG. 3A is a perspective view of a memory device comprising a set of blocks in an example 3D configuration of the non-volatile memory system of FIG. 1 according to aspects of the disclosure.

FIG. 3A is a perspective view of a memory device 300 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The substrate has a major surface that extends in the x-y plane. The blocks may be formed over the major surface. The peripheral area 304 runs along an edge of each block while the peripheral area 305 is at an end of the set of blocks. Each peripheral area can include circuitry, including but not limited to voltage drivers which can be connected to control gate layers, bit lines and source lines of the blocks.

The substrate 301 can also carry circuitry under the blocks, along with one or more lower metal layers which are patterned in conductive paths to carry signals of the circuitry. The blocks are formed in an intermediate region 302 of the memory device. In an upper region 303 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 3B:
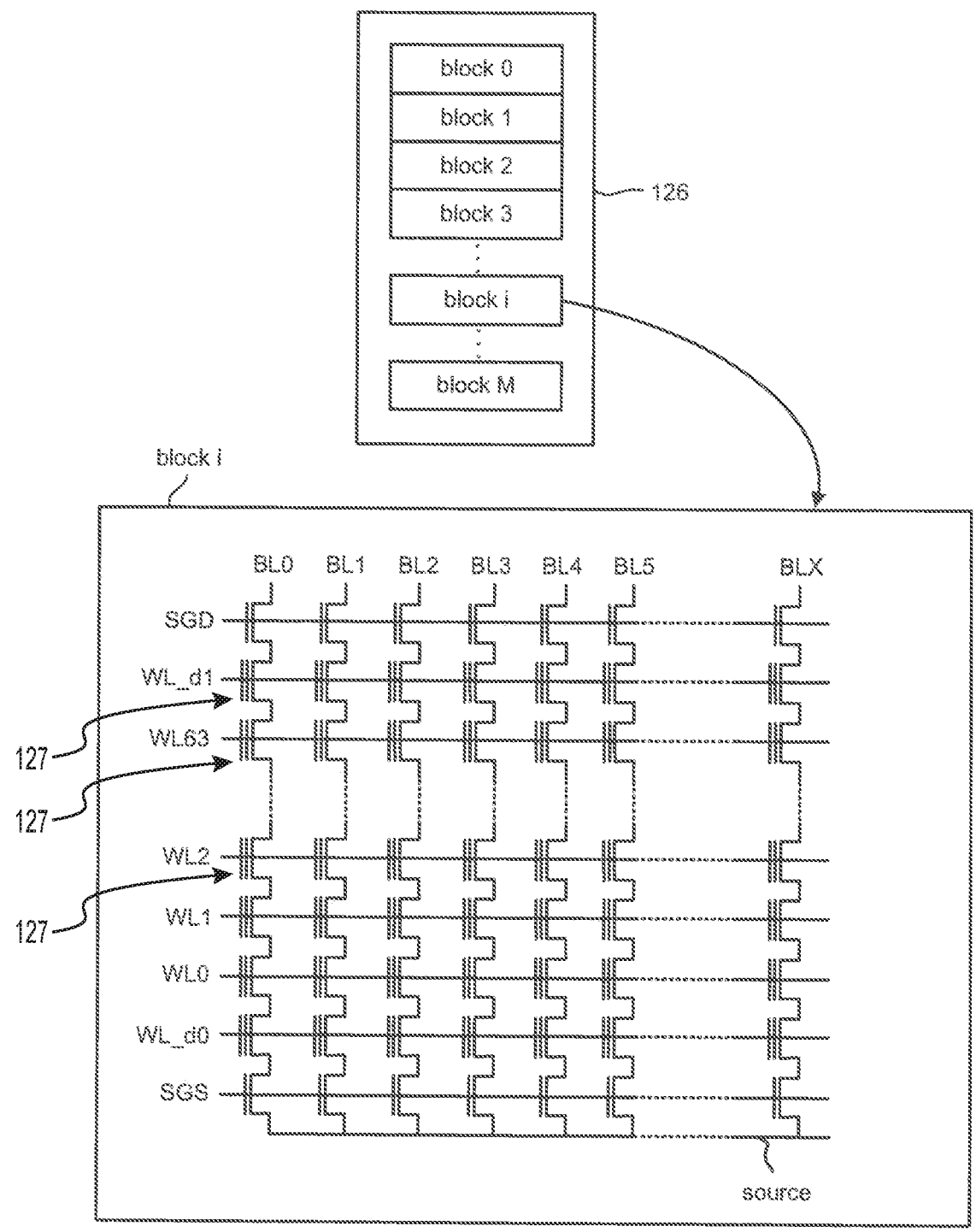
FIG. 3B depicts an exemplary structure of a memory cell array according to aspects of the disclosure.

FIG. 3B depicts an exemplary structure of memory cell array 126. In one embodiment, the array of memory cells is divided into M blocks of memory cells. The block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller calculates the ECC parity when data is being programmed into the array, and also checks it when data is being read from the array. Alternatively, the ECCs and/or other overhead data are stored in different pages, or even different blocks, than the user data to which they pertain.

FIG. 3B also shows more details of block i of memory array 126. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

In one embodiment, memory cells on some of the NAND strings are used for storing user data (both user data and ECCs and/or other overhead data), and memory cells on other NAND strings are used for storing memory system information. The memory cells that store used data may be referred to as user memory cells. Note that the user memory cells for a given word line may store what is commonly referred to as a codeword, which may comprise the user data and parity bits. The memory cells that store system data may be referred to as user memory cells. In one embodiment, the temperature codes are stored in system memory cells. Note that the temperature codes are not part of the codeword in such an embodiment. Hence, the temperature code can be read from the system memory cells without the need to read any of the user memory cells.

Figure 3C:
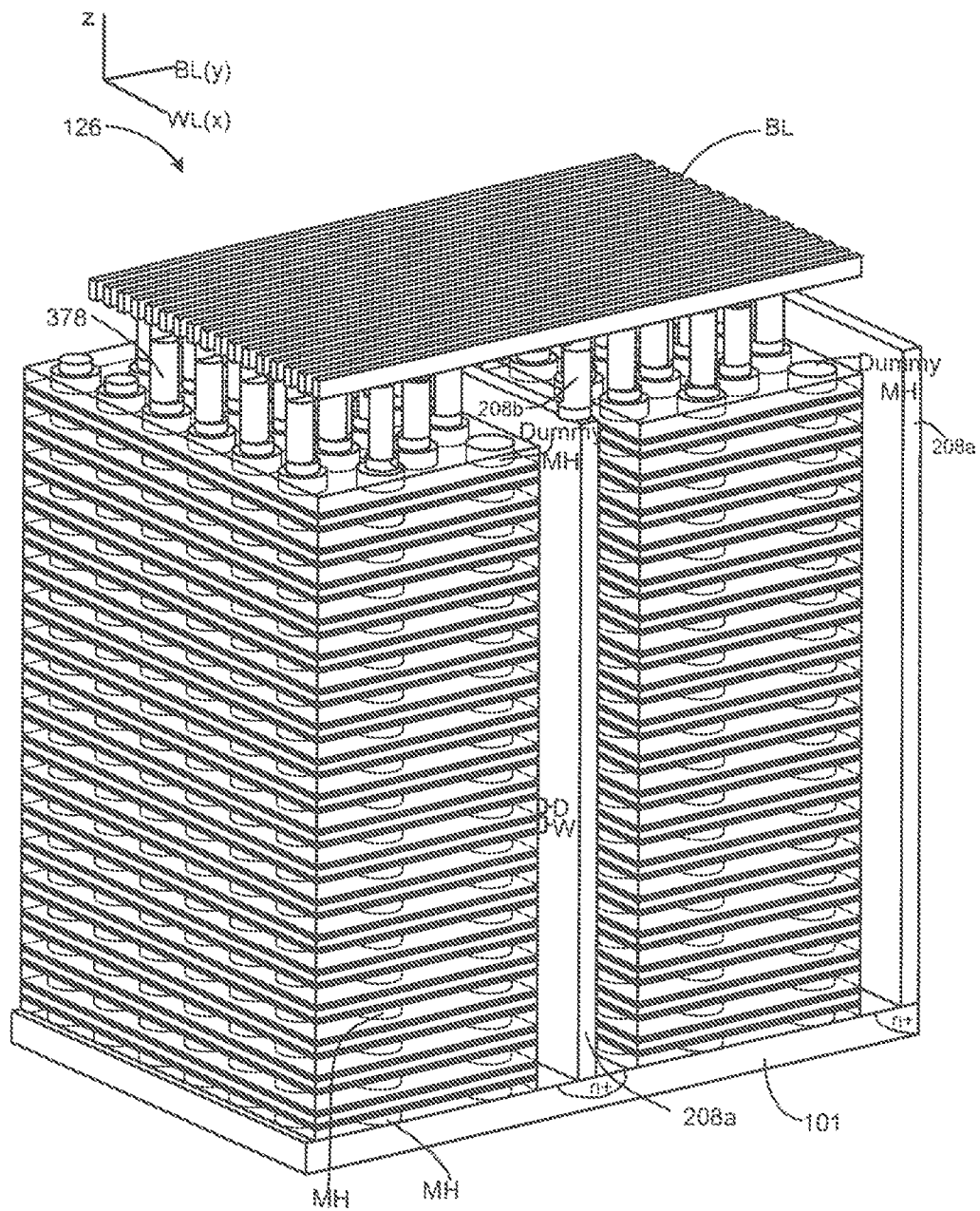
FIG. 3C is a perspective view of a portion of a three dimensional monolithic memory structure according to aspects of the disclosure.

FIG. 3C is a perspective view of a portion of a three dimensional monolithic memory structure 126, which includes a plurality memory cells. For example, FIG. 3C shows a portion of one block of memory. The structure 126 depicted includes a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. The alternating dielectric layers and conductive layers are divided into "fingers" by local source lines 208a. Note that the local source lines 208a may also be referred to as local interconnects LI. FIG. 3B only shows two fingers and two local interconnects LI. The local source lines 208a are conductive elements. Below and the alternating dielectric layers and word line layers is a substrate 101. Each local source line 208a is in electrical contact with an n+ diffusion region of the substrate 101.

Memory holes are formed in the stack of alternating dielectric layers and conductive layers. For example, one of the memory holes is marked as MH. Note that in FIG. 3B, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. Two of the memory holes, which are not used for data storage, are labeled as dummies (Dummy MH).

A number of bit lines (BL) are depicted over the top of the structure 126. Each bit line is connected to one of the memory holes (other than the Dummy MH) by a bit line contact 378. By providing a voltage to the source line 208$b$, the local source lines 208$a$ may provide a voltage to the substrate 101. The voltage from the substrate 101 may be provided to the memory cells under control of a source side select line (SGS). In this manner, the local source lines 208$a$ may provide operational voltages to memory cells.

Figure 4:
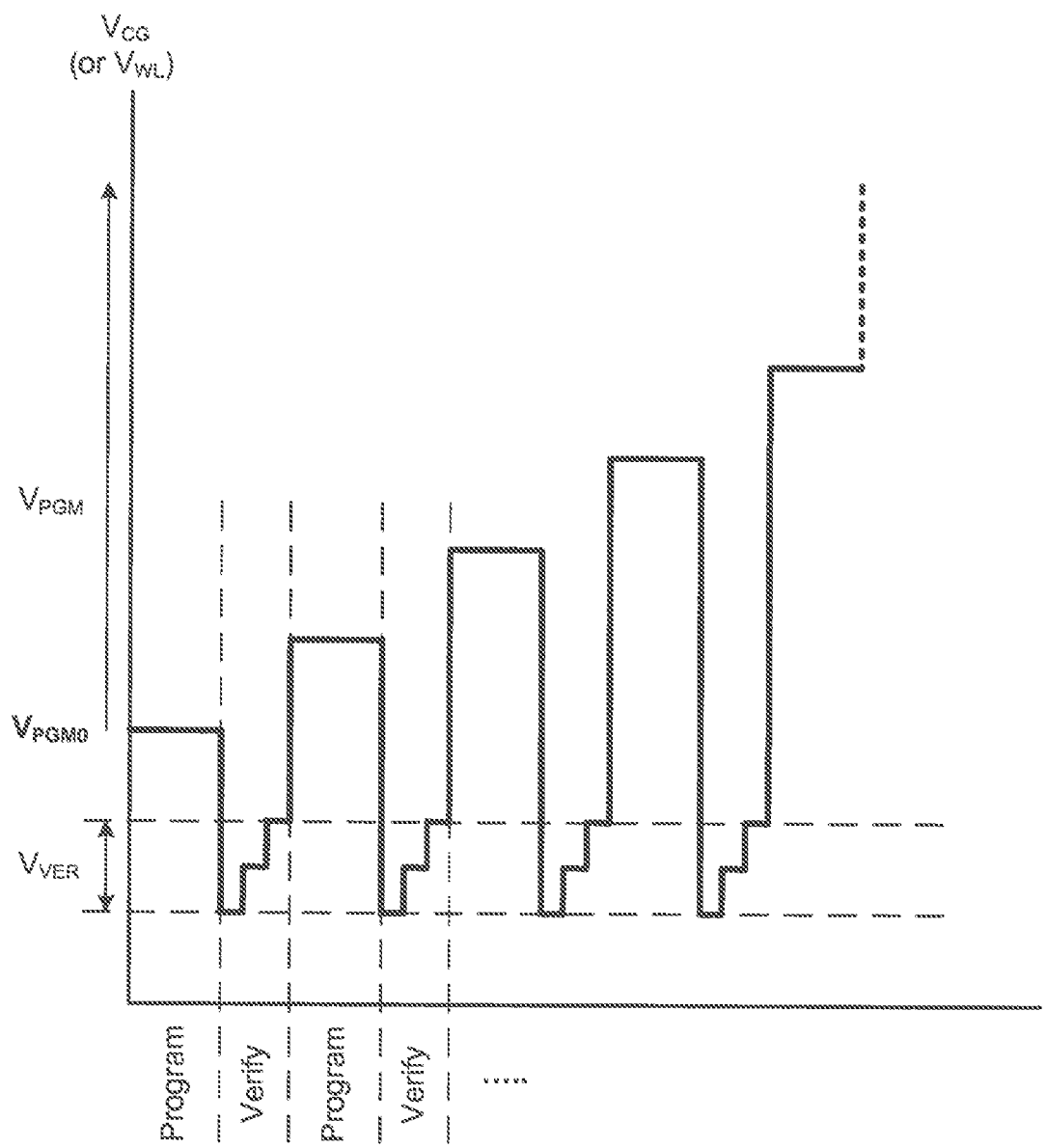
FIG. 4 illustrates a series of programming voltage pulses in the form of a staircase waveform being applied to a selected word line according to aspects of the disclosure.

FIG. 4 illustrates a series of programming voltage pulses in the form of a staircase waveform being applied to a selected word line (e.g., WL1 of FIG. 3B). As discussed above, when a cell 127 is programmed to a given state, it is subject to successive programming voltage pulses, each time attempting to add incremental charges to the floating gate. In between programming pulses, the cell is read back or verified to determine its source-drain current relative to a breakpoint level. Programming stops for a cell 127 when it has been verified to reach the desired state. The programming pulse train used may have increasing period or amplitude in order to counteract the accumulating electrons programmed into the charge storage unit of the memory cell 127. A pulse that moves more charge into a memory cell 127 than another is said to be coarser or that another programs with a finer granularity. Programming circuits generally apply a series of programming pulses to a selected word line. In this way, a page of memory cells 127 whose control gates are connected to the word line can be programmed together. Whenever a memory cell 127 of the page has been programmed to its target state, it is program-inhibited while the other cells continue to be subject to programming until all cells 127 of the page have been program-verified.

As discussed previously, a common benchmark for solid state drives or other devices employing memory system 100 is sustained sequential write. The memory structure 126 of the memory system 100 can, for example, include a plurality of non-volatile memory cells 127 (FIG. 3B) including a plurality of single level cell (SLC) cache cells (e.g., 4 gigabytes (GB)). As best shown in FIG. 5(0), the plurality of single level cell cache cells form a plurality of single level cache cell blocks 400 (i.e., a static SLC cache 402) with each of the plurality of single level cell cache cells storing one bit. According to an aspect, the number of the single level cell cache cell blocks 400 may be fixed, so the plurality of single level cell cache cell blocks 400 may always be used as a static SLC cache 402. Nevertheless, it should be appreciated that the memory system 100 may not utilize a static SLC cache 402 and/or the number of the single level cell cache cell blocks 400 may not be fixed. As shown in FIG. 5(1), the plurality of single level cache cell blocks 400 are used for high performance burst sequential write (i.e., 4 GB logical block address (LBA) range). The SLC cache 402 leads to a significant difference in performance for burst versus sustained sequential write, as illustrated in the graphs indicating the throughput of the memory system 100 associated with FIGS. 5(1)-5(3).

The memory structure 126 of the memory system 100 also includes a plurality of multi-bit cells (non-volatile memory cells 127 shown in FIG. 3B) typically storing more than one bit of data and forming a plurality of multi-bit cell blocks 404. In addition to the fixed SLC cache 402, additional performance improvements can be realized by extending the size of the high performance sequential write (e.g., 30 GB instead of 4 GB) using a dynamic cache 406 shown in FIGS. 5(1)-5(3). Specifically, this dynamic cache 406 utilizes the plurality of multi-bit cell blocks 404 (e.g., triple level cells (TLC)) in a single-bit mode. So, the plurality of multi-bit cells (e.g., ternary or triple level cells) of the plurality of multi-bit cell blocks 404 are used for sustained sequential write (shown in FIG. 5(2)), for example. Thus, the dynamic cache 406 provides increased burst sequential write range. The plurality of multi-bit cell blocks 404 are also used in a multi-bit mode. As shown in FIG. 5(3), the sustained sequential write can even extend the full LBA range.

Each of the plurality of non-volatile memory cells 127 is associated with one of the word lines and is configured to retain a threshold voltage within a common range of threshold voltages ($V_{TH}$) defining a threshold window, shown in FIG. 6(0). The threshold window is partitioned into a plurality of bands of threshold voltages representing the plurality of bits and including a lowest band denoting an erased state ("Er"), shown in FIG. 6(1). According to an aspect, the erased state ("Er") can correspond with a ground state (i.e., no threshold voltage). The plurality of bands of threshold voltages also includes a plurality of increasing bands (e.g., extending between $D_{Gr}$ and $D_1$ demarcations, between $D_1$ and $D_2$ demarcations, etc. of FIG. 6(0)) that each denote increasing programmed states (e.g., "A", "B", "C", "D", "E", "F", and "G" for triple level or ternary cells) following the erased state ("Er") and each of the plurality of bands of threshold voltages has a band width W. It should be appreciated that the band width W may also be narrower if additional programmed states are utilized (e.g., quad level cells) or broader if fewer programmed states are utilized (e.g., two bits per state).

So, as discussed, the memory system 100 includes the control circuit 110 in communication with the non-volatile memory cells and the word lines. The control circuit 110 is configured to program a first set of the data into the plurality of multi-bit cells associated with selected word lines in the single-bit mode. Specifically, in the single-bit mode, each of the plurality of multi-bit cells stores one bit using a pair of first target states representing the one bit including the erased state and a tight intermediate state ("TI") having a distribution of the threshold voltage being no wider than the band width W of a single one of the plurality of increasing bands. During programming of the first set of the data to the plurality of multi-bit cells in the single-bit mode, the verifying that occurs may, for example, be relative to a $DV_{TI}$ demarcation (FIG. 6(2)); however, other demarcations may alternatively be utilized.

FIG. 7 illustrates a common threshold voltage distribution for LM programming. The threshold voltage distribution for the LM state spans a broad range of threshold voltages and typically spans more than the band width W of one of the plurality of increasing bands. In contrast, the tight intermediate state ("TI") is shown in FIG. 8 and has a distribution of the threshold voltages that is not wider than the band width W of one of the plurality of increasing bands. According to an aspect, the distribution of the threshold voltage associated with the tight intermediate state ("TI") is within a single one of the plurality of increasing bands. According to another aspect, the distribution of the threshold voltage of each of the multi-bit cells in the tight intermediate state ("TI") may be within a first one of the plurality of increasing bands adjacent the erased state (FIG. 6(2)). According to yet another aspect, the plurality of bits stored by each of the plurality of multi-bit cells can include N bits of data and the plurality of increasing bands of the threshold window include $2^N=k+1$ bands of threshold voltages using k demarcation points $D_i$, shown in FIG. 6(0). As discussed, the plurality of increasing bands includes k increasing bands that denote k increasing programmed states P(i) (e.g., "A", "B", "C", "D", "E", "F", and "G") following the erased state ("Er"). Thus, according to another aspect, the threshold voltage of each of the plurality of multi-bit cells in the tight intermediate state ("TI") may not exceed a voltage of a $D_1$ demarcation point.

Programming the data into the plurality of multi-bit cells in each of the plurality of multi-bit cell blocks 404 one block at a time using LM programming would ordinarily introduce significant program disturb and high failure bit count. The reason for this program disturb is that the LM state has a wider or broader threshold voltage distribution, which results in worse boosting. The tight intermediate state ("TI") may be lower performance and have a reduced read margin compared to the typical LM state; however, due to the threshold voltage distribution of the tight intermediate state ("TI") (FIG. 8) being narrower (i.e., covering a smaller range of threshold voltages in the threshold window) than the threshold voltage distribution for the typical LM state (FIG. 7), the program disturb can be mitigated.

The control circuit 110 is additionally configured to program a second set of the data into the plurality of multi-bit cells associated with selected word lines in the multi-bit mode with each of the plurality of multi-bit cells storing the plurality of bits. During programming of the second set of the data to the plurality of multi-bit cells in the multi-bit mode, the verifying that occurs may be relative to associated demarcations (e.g., $DV_A$, $DV_B$, $DV_C$, $DV_D$, $DV_E$, $DV_F$, and $DV_G$, shown in FIG. 6(3), for "A", "B", "C", "D", "E", "F", and "G" programmed states); yet, alternative demarcations could be used instead.

By programming the plurality of multi-bit cells to the tight intermediate state ("TI") in the single-bit mode and then later using the multi-bit mode to store the plurality of bits, read margin due to WL-WL coupling may be gained. Such operation has some similarities to LM-Fine default programming shown in FIG. 9. For LM-Fine default, one word line WLn is programmed to an LM state (two level, single bit). Then a next word line WLn+1 is programmed to LM state. Then the one word line WLn is programmed to the fine state (8 level, three bits). This sequence is repeated for an entire block. LM-Fine default program sequence can gain some performance for a given bit error rate (BER) compared to direct TLC write; however, any data written using LM-Fine default is written to alternating cells on WLn and then WLn+1.

Instead of LM-Fine default programming, the control circuit 110 is configured to program the first set of the data into the plurality of multi-bit cells in each of the plurality of multi-bit cell blocks one block at a time in the single-bit mode as shown in FIG. 10, rather than the LM-Fine Default operation shown in FIG. 9. Similarly, the control circuit 110 can also be configured program the second set of the data into the plurality of multi-bit cells in the each of the plurality of multi-bit cell blocks 404 one block at a time in the multi-bit mode. Such programming the first set of the data into the plurality of multi-bit cells in each of the plurality of multi-bit cell blocks 404 one block at a time in the single-bit mode provides more efficient operation of the dynamic cache 406, because the plurality of multi-bit cell cells are programmed sequentially, rather than via alternating word lines.

Referring back to FIGS. 6(0)-6(3), if the plurality of multi-bit cells are ternary level cells, the plurality of bits of the second set of the data stored in each of plurality of multi-bit cells includes a lower bit and a middle bit and an upper bit. According to an aspect, the lower bit is the one bit of the first set of data. So, to form the second set of the data, the control circuit 110 is further configured to read the one bit of the first set of data from each of the plurality of multi-bit cells storing the one bit and form the second set of the data to be stored in the plurality of multi-bit cells using the one bit of the first set of data and the middle bit and the upper bit. Thus, the addition of the middle and upper bit to the lower bit is the one bit of the first set of data only involves additional programming voltage pulses to add incremental charges to program each of the plurality of multi-bit cells to the desired programmed state (e.g., "A", "B", "C", "D", "E", "F", and "G"). Depending on the middle and upper bits and desired coding, additional programming voltage pulses may not be needed (e.g., if all of the bits are a logical one, the desired programmed state may be the erased state). Consequently, only one erase cycle is required for each of the multi-bit cells. While ternary or triple level cells are discussed, additional or fewer bits per cell may be utilized.

According to an aspect, the memory system 100 includes a known quantity of the plurality of multi-bit cells and the control circuit 110 is configured to program the second set of the data into the plurality of multi-bit cells in the multi-bit mode in response to the known quantity of the plurality of multi-bit cells being completely filled with the one bit in the single-bit mode. In other words, the plurality of multi-bit cells are filled in the single-bit mode first until all of the plurality of multi-bit cells are used in this way, then the control circuit 110 programs the second set of the data into the plurality of multi-bit cells in the multi-bit mode (e.g., with the lower bit being the one bit of the first set of data).

As an alternative to programming the first set of data to plurality of multi-bit cell blocks 404 using the tight intermediate state as discussed above, the plurality of multi-bit cell blocks 404 could simply utilized as SLC blocks and in idle time (or foreground to meet capacity), these SLC blocks could be compacted with other SLC blocks (e.g., two other SLC blocks for TLC blocks) into single multi-bit cell blocks. Such a procedure is sometimes referred to as hybrid blocks. The use of hybrid blocks would still come with the benefit of increased burst sequential write range, like with the dynamic cache 406 described above, but would lead to a number of drawbacks. These drawbacks include an endurance impact, since one multi-bit write requires multiple erase cycles (EC). For instance, if the plurality of multi-bit cells of the plurality of multi-bit cell blocks 404 are triple level cells (TLC), three SLC and one TLC erase cycles would be required for each TLC. This increased number of erase operations can adversely affect the durability or lifetime of the solid-state memory. In addition, sustained sequential write performance would be reduced due to SLC to TLC compaction on top of slow TLC writes.

Thus, referring back to FIGS. 5(0)-5(3), the plurality of single level cell cache cell blocks 400 are initially filled, resulting in the throughput shown in FIG. 5(1). Then, the plurality of multi-bit cell blocks 404 are utilized as the dynamic cache 406 and are programmed by the control circuit 110 with the first set of the data (one block at a time) for a sequential write exceeding the size of the static SLC cache 402. The resulting throughput is shown in FIG. 5(2). A sustained sequential write utilizing the full LBA range is shown in FIG. 5(3), in which the control circuit 110 may read the one bit of the first set of data from each of the plurality of multi-bit cells storing the one bit and forms the second set of the data to be stored in the plurality of multi-bit cells using the one bit of the first set of data and the middle bit and the upper bit (for TLC). Because the control circuit 110 programs the second set of the data without erasing the plurality of multi-bit cells, the drawbacks of hybrid blocks described above (4 EC for 1 TLC, SLC to TLC compaction overhead) are overcome.

As best shown in FIGS. 11 and 12, a method of operating a non-volatile memory system 100 is also provided. The method includes the step of 500 providing the non-volatile memory system 100 with a plurality of non-volatile memory cells 127 and word lines, each of the plurality of non-volatile memory cells 127 associated with one of the word lines and configured to retain a threshold voltage within a common range of threshold voltages defining a threshold window, the plurality of non-volatile memory cells 127 including a plurality of multi-bit cells each configured to store a plurality of bits of data with the threshold window partitioned into a plurality of bands of threshold voltages representing the plurality of bits and each of the plurality of bands of threshold voltages having a band width W, the plurality of bands of threshold voltages including a lowest band denoting an erased state and a plurality of increasing bands. As discussed, the the non-volatile memory system 100 includes a plurality of single level cell cache cells forming a plurality of single level cache cell blocks 400 with each of the plurality of single level cell cache cells storing one bit. Therefore, the method can include the step of 502 erasing a plurality of single level cell cache cells associated with selected word lines. The method can continue with the step of 504 programming data into the plurality of single level cell cache cells associated with selected word lines in the plurality of single level cache cell blocks 400 in a burst mode using one bit per cell. The method can also include the step of 506 erasing the plurality of multi-bit cells associated with selected word lines in the block in a plurality of multi-bit cell blocks 404 (as described above, this is the only erase cycle necessary for the programming the data).

The method proceeds with the step of 508 programming a first set of data into the plurality of multi-bit cells associated with selected word lines in a single-bit mode with each of the plurality of multi-bit cells storing one bit using a pair of first target states representing the bit being one of the erased state and a tight intermediate state ("TI") having a distribution of the threshold voltage being no wider than the band width of a single one of the plurality of increasing bands. As discussed, the distribution of the threshold voltage associated with the tight intermediate state may be within a single one of the plurality of increasing bands. The distribution of the threshold voltage associated with the tight intermediate state may also be within a first one of the plurality of increasing bands adjacent the erased state. In addition, the plurality of bits stored by each of the plurality of multi-bit cells can include N bits of data. As a result, the plurality of increasing bands of the threshold window include $2^N=k+1$ bands of threshold voltages using k demarcation points $D_i$ and the plurality of increasing bands includes k increasing bands that denote k increasing programmed states P(i) following the erased state and the threshold voltage of each of the plurality of multi-bit cells in the tight intermediate state may not exceed a voltage of a $D_1$ demarcation point.

As described above with reference to FIG. 4, programming involves a sequence of programming pulses and verification. Consequently, the step of 508 programming a first set of data into the plurality of multi-bit cells associated with selected word lines in a single-bit mode with each of the plurality of multi-bit cells storing one bit using a pair of first target states representing the bit being one of the erased state and a tight intermediate state ("TI") having a distribution of the threshold voltage being no wider than the band width of a single one of the plurality of increasing bands can include programming each of the plurality of multi-bit cells to be programmed to the tight intermediate state using programming pulses. The method can then proceed with the step of verifying each of the plurality of multi-bit cells to be programmed to the tight intermediate state relative to a predetermined tight intermediate verify threshold voltage $DV_{TI}$ (FIG. 6(2)). According to an aspect, the predetermined tight intermediate verify threshold voltage $DV_{TI}$ is larger than an erased threshold voltage of the erased state and less than a voltage of a $D_1$ demarcation point, the threshold voltage of each of the plurality of multi-bit cells in the tight intermediate state not exceeding the voltage of the $D_1$ demarcation point. Yet, other predetermined tight intermediate verify threshold voltages $DV_{TI}$ may be alternatively used.

Since the plurality of non-volatile memory cells 127 can be ternary level cells, the plurality of bits of the second set of the data stored in each of plurality of multi-bit cells includes a lower bit and a middle bit and an upper bit. At least one of the lower bit and the middle bit and the upper bit being the one bit of the first set of data (e.g., the lower bit is the one bit of the first set of data). So, the method further includes the steps of 510 reading the one bit of the first set of the data from each of the plurality of multi-bit cells storing the one bit and 512 forming the second set of the data to be stored in the plurality of multi-bit cells using the one bit of the first set of data and the middle bit and the upper bit. The method then includes the step of 514 programming a second set of the data into the plurality of multi-bit cells associated with selected word lines in a multi-bit mode with each of the plurality of multi-bit cells storing the plurality of bits. The step of 512 forming the second set of the data to be stored in the plurality of multi-bit cells using the one bit of the first set of data and the middle bit and the upper bit, may also include copying the first set of data out of the plurality of multi-bit cell blocks 404 (i.e., "off chip" copy of the lower bits) prior to programming the second set of the data due to reduced read margin resulting from the tight intermediate state ("TI"). Nevertheless, such an off-chip copy may not be utilized. Additionally, the read margin can be tuned through the selection of the demarcation associated with the threshold voltage used in verifying the "A" programmed state, $DV_A$ (FIG. 6(3)).

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated degrees or at other orientations) and the spatially relative descriptions used herein interpreted accordingly.

What is claimed is:

1. An apparatus, comprising:
a plurality of non-volatile memory cells and word lines, each of the plurality of non-volatile memory cells being associated with one of the word lines and configured to retain a threshold voltage within a common range of threshold voltages defining a threshold window;
the plurality of non-volatile memory cells including a plurality of multi-bit cells each configured to store a plurality of bits of data with the threshold window partitioned into a plurality of bands of threshold voltages representing the plurality of bits and each having a band width, the plurality of bands of threshold voltages including a lowest band denoting an erased state and a plurality of increasing bands; and
a control circuit in communication with the plurality of non-volatile memory cells and word lines, the control circuit configured to:
program a first set of the data into the plurality of multi-bit cells associated with selected word lines in a single-bit mode with each of the plurality of multi-bit cells storing one bit using a pair of first target states representing the one bit being one of the erased state and a tight intermediate state having a distribution of the threshold voltage being no wider than the band width of a single one of the plurality of increasing bands,
program a second set of the data into the plurality of multi-bit cells associated with selected word lines in a multi-bit mode with each of the plurality of multi-bit cells storing the plurality of bits.

2. The apparatus as set forth in claim 1, wherein the distribution of the threshold voltage associated with the tight intermediate state is within a single one of the plurality of increasing bands.

3. The apparatus as set forth in claim 1, wherein the distribution of the threshold voltage associated with the tight intermediate state is within a first one of the plurality of increasing bands adjacent the erased state.

4. The apparatus as set forth in claim 1, wherein the plurality of bits stored by each of the plurality of multi-bit cells includes N bits of data and the plurality of increasing bands of the threshold window include $2^N = k+1$ bands of threshold voltages using k demarcation points $D_i$ and the plurality of increasing bands includes k increasing bands that denote k increasing programmed states P(i) following the erased state and the threshold voltage of each of the plurality of multi-bit cells in the tight intermediate state does not exceed a voltage of a $D_1$ demarcation point.

5. The apparatus as set forth in claim 4, wherein N=3.

6. The apparatus as set forth in claim 1, wherein the plurality of non-volatile memory cells includes a plurality of single level cell cache cells forming a plurality of single level cache cell blocks with each of the plurality of single level cell cache cells storing one bit and wherein the control circuit is further configured to program the first set of the data into the plurality of single level cell cache cells associated with selected word lines in each of the plurality of single level cell cache cell blocks in a burst mode until the plurality of single level cell cache cell blocks are filled.

7. The apparatus as set forth in claim 1, wherein the plurality of multi-bit cells form a plurality of multi-bit cell blocks and the control circuit is configured to:
program the first set of the data into the plurality of multi-bit cells in each of the plurality of multi-bit cell blocks one block at a time in the single-bit mode, and
program the second set of the data into the plurality of multi-bit cells in the each of the plurality of multi-bit cell blocks one block at a time in the multi-bit mode.

8. The apparatus as set forth in claim 1, wherein the plurality of multi-bit cells are ternary level cells and the plurality of bits of the second set of the data stored in each of plurality of multi-bit cells includes a lower bit and a middle bit and an upper bit with at least one of the lower bit and the middle bit and the upper bit being the one bit of the first set of the data and the control circuit is further configured to:
read the one bit of the first set of the data from each of the plurality of multi-bit cells storing the one bit; and form the second set of the data to be stored in the plurality of multi-bit cells using the one bit of the first set of the data and the middle bit and the upper bit.

9. The apparatus as set forth in claim 1, wherein the apparatus includes a known quantity of the plurality of multi-bit cells and the control circuit is configured to program the second set of the data into the plurality of multi-bit cells in the multi-bit mode in response to the known quantity of the plurality of multi-bit cells being completely filled with the one bit in the single-bit mode.

10. A non-volatile memory system, comprising:
a plurality of non-volatile memory cells and word lines, each of the plurality of non-volatile memory cells being associated with one of the word lines and configured to retain a threshold voltage within a common range of threshold voltages defining a threshold window, the plurality of non-volatile memory cells including a plurality of multi-bit cells each being configured to store a plurality of bits of data with the threshold window partitioned into a plurality of bands of threshold voltages representing the plurality of bits and each of the plurality of bands of threshold voltages having a band width, the plurality of bands of threshold voltages including a lowest band denoting an erased state and a plurality of increasing bands; and
data programming means for (a) programming a first set of the data into the plurality of multi-bit cells associated with selected word lines in a single-bit mode with each of the plurality of multi-bit cells storing one bit using a pair of first target states representing the bit being one of the erased state and a tight intermediate state having a distribution of the threshold voltage being no wider than the band width of a single one of the plurality of increasing bands and (b) programming a second set of the data into the plurality of multi-bit cells associated with selected word lines in a multi-bit mode with each of the plurality of multi-bit cells storing the plurality of bits.

11. The non-volatile memory system as set forth in claim 10, wherein the distribution of the threshold voltage associated with the tight intermediate state is within a single one of the plurality of increasing bands.

12. The non-volatile memory system as set forth in claim 10, wherein the distribution of the threshold voltage associated with the tight intermediate state is within a first one of the plurality of increasing bands adjacent the erased state.

13. The non-volatile memory system as set forth in claim 10, wherein the plurality of bits stored by each of the plurality of multi-bit cells includes N bits of data and the plurality of increasing bands of the threshold window include $2^N = k+1$ bands of threshold voltages using k demarcation points $D_i$ and the plurality of increasing bands includes k increasing bands that denote k increasing programmed states P(i) following the erased state and the threshold voltage of each of the plurality of multi-bit cells in the tight intermediate state does not exceed a voltage of a $D_1$ demarcation point.

14. The non-volatile memory system as set forth in claim 10, wherein the plurality of non-volatile memory cells includes a plurality of single level cell cache cells forming a plurality of single level cache cell blocks with each of the plurality of single level cell cache cells storing one bit and the data programming means is further configured to program data into the plurality of single level cell cache cells associated with selected word lines in each of the plurality of single level cell cache cell blocks in a burst mode using one bit per cell until the plurality of single level cell cache cell blocks are filled.

15. A method of operating a non-volatile memory system, method comprising the steps of:
providing the non-volatile memory system with a plurality of non-volatile memory cells and word lines, each of the plurality of non-volatile memory cells associated with one of the word lines and configured to retain a threshold voltage within a common range of threshold voltages defining a threshold window, the plurality of non-volatile memory cells including a plurality of multi-bit cells each configured to store a plurality of bits of data with the threshold window partitioned into a plurality of bands of threshold voltages representing the plurality of bits and each of the plurality of bands of threshold voltages having a band width, the plurality of bands of threshold voltages including a lowest band denoting an erased state and a plurality of increasing bands;
programming a first set of the data into the plurality of multi-bit cells associated with selected word lines in a single-bit mode with each of the plurality of multi-bit cells storing one bit using a pair of first target states representing the bit being one of the erased state and a tight intermediate state having a distribution of the threshold voltage being no wider than the band width of a single one of the plurality of increasing bands; and
programming a second set of the data into the plurality of multi-bit cells associated with selected word lines in a multi-bit mode with each of the plurality of multi-bit cells storing the plurality of bits.

16. The method as set forth in claim 15, wherein the distribution of the threshold voltage associated with the tight intermediate state is within a single one of the plurality of increasing bands.

17. The method as set forth in claim 15, wherein the distribution of the threshold voltage associated with the tight intermediate state is within a first one of the plurality of increasing bands adjacent the erased state.

18. The method as set forth in claim 15, wherein the plurality of bits stored by each of the plurality of multi-bit cells includes N bits of data and the plurality of increasing bands of the threshold window include $2^N = k+1$ bands of threshold voltages using k demarcation points $D_i$ and the plurality of increasing bands includes k increasing bands that denote k increasing programmed states P(i) following the erased state and the threshold voltage of each of the plurality of multi-bit cells in the tight intermediate state does not exceed a voltage of a $D_1$ demarcation point.

19. The method as set forth in claim 15, wherein the non-volatile memory system further includes a plurality of single level cell cache cells forming a plurality of single level cache cell blocks with each of the plurality of single level cell cache cells storing one bit and the method further includes the steps of:
erasing the plurality of single level cell cache cells associated with selected word lines; and
programming data into the plurality of single level cell cache cells associated with selected word lines in the plurality of single level cache cell blocks in a burst mode using one bit per cell.

20. The method as set forth in claim 15, wherein the plurality of multi-bit cells are ternary level cells and the plurality of bits of the second set of the data stored in each of plurality of multi-bit cells includes a lower bit and a middle bit and an upper bit with at least one of the lower bit and the middle bit and the upper bit being the one bit of the first set of the data and the method further includes the steps of:

reading the one bit of the first set of the data from each of the plurality of multi-bit cells storing the one bit; and forming the second set of the data to be stored in the plurality of multi-bit cells using the one bit of the first set of the data and the middle bit and the upper bit.

\* \* \* \* \*